(12) United States Patent
Aptaker et al.

(10) Patent No.: US 9,847,740 B2
(45) Date of Patent: Dec. 19, 2017

(54) HIGH VOLTAGE ELECTROSTATIC GENERATOR

(71) Applicants: Peter Simon Aptaker, Wantage (GB); Paul Beasley, Abingdon (GB); Oliver Heid, Erlangen (DE)

(72) Inventors: Peter Simon Aptaker, Wantage (GB); Paul Beasley, Abingdon (GB); Oliver Heid, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 145 days.

(21) Appl. No.: 14/432,052

(22) PCT Filed: Sep. 28, 2012

(86) PCT No.: PCT/EP2012/069243
§ 371 (c)(1),
(2) Date: Mar. 27, 2015

(87) PCT Pub. No.: WO2014/048496
PCT Pub. Date: Apr. 3, 2014

(65) Prior Publication Data
US 2015/0270792 A1 Sep. 24, 2015

(51) Int. Cl.
*H02N 99/00* (2006.01)
*H05H 5/04* (2006.01)
(Continued)

(52) U.S. Cl.
CPC ......... *H02N 99/00* (2013.01); *G06F 17/5009* (2013.01); *H05H 5/04* (2013.01);
(Continued)

(58) Field of Classification Search
CPC ............ H02N 1/00; H02N 99/00; H05H 5/04; H05H 5/045; H05H 5/066; G06F 17/50
(Continued)

(56) References Cited

U.S. PATENT DOCUMENTS 3,731,211 A * 5/1973 Purser ...................... H05H 5/02
313/361.1
7,710,051 B2 * 5/2010 Caporaso ................ H01J 27/26
315/500
(Continued)

FOREIGN PATENT DOCUMENTS

JP H0567445 A 3/1993
JP H05234698 A 9/1993
(Continued)

OTHER PUBLICATIONS

Beasley et al., "A New Life for High Voltage Electrostatic Accelerators," Proceedings of IPAC I'10, Kyoto, Japan, pp. 711-713 (2010).
(Continued)

*Primary Examiner* — John K Kim
(74) *Attorney, Agent, or Firm* — Schiff Hardin LLP

(57) ABSTRACT

A high-voltage electrostatic generator has an assembly of concentric electrically conductive half-shells separated by an equatorial gap, essentially with cylindrical symmetry about an axis. Adjacent to the equatorial gap, edge regions of at least a selected subset of the half-shells are shaped.

6 Claims, 9 Drawing Sheets

(51) Int. Cl.
  *H05H 5/06* (2006.01)
  *G06F 17/50* (2006.01)
  *H02N 1/00* (2006.01)
(52) U.S. Cl.
  CPC ............ *H05H 5/045* (2013.01); *H05H 5/066* (2013.01); *H02N 1/00* (2013.01)
(58) Field of Classification Search
  USPC ......... 310/301, 309; 315/506; 250/281, 282, 250/287, 288
  IPC ............ G06F 17/50; H02N 99/00; H05H 5/04
  See application file for complete search history.

(56) References Cited

U.S. PATENT DOCUMENTS

| | | | | |
|---|---|---|---|---|
| 7,924,121 B2* | 4/2011 | Caporaso | ............... | H01P 3/16 315/500 |
| 7,994,739 B2* | 8/2011 | Chen | ............... | H01J 35/00 250/298 |
| 8,637,815 B2* | 1/2014 | Makarov | ............... | H01J 49/40 250/281 |
| 8,653,761 B2* | 2/2014 | Heid | ............... | H05H 5/06 315/500 |
| 8,723,451 B2* | 5/2014 | Heid | ............... | H05H 5/02 315/3.6 |
| 8,754,596 B2* | 6/2014 | Heid | ............... | H05H 5/04 315/500 |
| 8,760,086 B2* | 6/2014 | Heid | ............... | G21B 3/00 315/500 |
| 9,412,578 B2* | 8/2016 | Makarov | ............... | H01J 49/406 |
| 2002/0047545 A1 | 4/2002 | Paulus et al. | | |
| 2002/0047575 A1 | 4/2002 | Iwami | | |
| 2012/0091332 A1* | 4/2012 | Makarov | ............... | H01J 49/40 250/282 |
| 2015/0270792 A1* | 9/2015 | Aptaker | ............... | H05H 5/045 310/309 |

FOREIGN PATENT DOCUMENTS

| | | |
|---|---|---|
| JP | 3917994-82 | 5/2007 |
| RU | 2119208 C1 | 9/1998 |
| SU | 1735909 A1 | 5/1992 |
| WO | WO-2012034717 A1 | 3/2012 |

OTHER PUBLICATIONS

Ruggiero, "Nuclear Fusion of Protons with Boron," Brookhave National Laboratoy (1992) pp. 1-19.

Mazarakis et al. "Productio, Transport and Injection of a Cold Non-Magnetized Electron Beam for the Recirculating Linac," Proceedings of the 1998 Linear Accelerator Conference, Williamsburg, Virginia, USA (1988) pp. 345-347.

Beasley et al. "A New Life for High Voltage Electrostatic Accelerators," Proceedings of IPAC'10, Kyoto, Japan (2010) pp. 711-713.

* cited by examiner

HIGH VOLTAGE ELECTROSTATIC GENERATOR

BACKGROUND OF THE INVENTION

Field of the Invention

The present invention relates to high-voltage electrostatic particle accelerators.

Description of the Prior Art

A high-voltage electrostatic particle accelerator is described in XP-002665162 Proceedings of IPAC '10 Kyoto, Japan, pp. 711-713 P. Beasley, O. Heid, T. Hughes "A new life for High Voltage Electrostatic accelerators".

An example of such an accelerator is shown in FIG. 1. In such accelerators, concentric conductive half-shells 10 are provided, electrically isolated from one another, but interconnected with diodes in a Cockroft-Walton (Greinacher) cascade. The concentric conductive shells provide the required capacitance. The shells may be enclosed within a vacuum vessel (not shown) such that the space around and between half-shells 10 is evacuated. Application of an AC voltage to the assembly causes each shell 10 to be charged to a certain DC voltage with respect to the next, resulting in a very large electrostatic potential difference between in the innermost and outermost shells.

FIG. 2 shows a simplified diagram illustrating the connection of diodes 15 between half-shells 10, and the connection of the AC supply 17. As shown, an AC supply 17 is connected between ground 30 and one half-shell, labelled 10a in the drawing. This is capacitively coupled to an inner adjacent half-shell labelled 10b. This is in turn capacitively coupled to an inner adjacent half-shell labelled 10c, and this is in turn capacitively coupled to an inner adjacent half-shell labelled 10d.

The AC voltage is capacitively coupled between half-shells 10a-10d. These AC-coupled half-shells are connected by diodes 15 to corresponding DC half-shells 10e-10h in the drawing to form the required Cockroft-Walton (Greinacher) cascade. In operation, the applied AC voltage is rectified and multiplied by twice the number of sets of half-shells used, so the maximum voltage which accumulates on the innermost DC half-shell 10h is 2×4×Vac. Voltages in the megavolt range are usually obtained. The voltage $U_{total}$ at the innermost DC half-shell may be expressed as $U_{total}=2nU_0$, with a superimposed ripple voltage. $U_0$ is the peak value of the AC input voltage $U_{in}$, so that $U_{in}=U_0 \sin(\omega t)$ Four concentric pairs of half-shells 10 are shown in FIG. 2, but a high-voltage electrostatic generator of the type addressed by the present invention may have rather more, or fewer, concentric pairs of half-shells depending on the desired output voltage.

By providing a path for a particle beam through the DC half-shells 10e-10h, a compact high-voltage electrostatic particle accelerator may be constructed.

FIG. 3 schematically illustrates such an accelerator in part-cross-section. In FIG. 3, the structure is essentially cylindrically symmetrical about axis A-A, with the exception of aligned holes 19 which form a path for a particle beam through the DC half-shells 10e-10h. References herein to 'radial' or 'axial' directions are intended with respect to this axis. The accelerator comprises a series of pairs electrically conductive half-shells 10 one connected via the external AC drive and the other with the developed DC voltages. The half-shells of each pair are spaced apart by an equatorial gap 14. A significant DC potential difference accumulates between the concentric shells, with the outermost DC half-shell typically being at ground voltage, and the innermost half-shells typically being at several megavolts. Structural integrity of the accelerator is provided by solid electrical insulators (not shown) between half-shells.

Conventionally, as illustrated in part-cross-section in FIG. 3, such high voltage electrostatic generators have half-shells 10 which are parallel to one another right up to their edge regions 16 on either side of the gap 14. The separation distance s between adjacent half-shells may vary, and this may be useful in providing an appropriate voltage gradient for an accelerating particle at all positions along the beam path, as the particle speed increases. The half-shells 10 are typically made from thin conducting materials with a square or rounded edge profile. Typically, the electrostatic generator is designed to be as small and lightweight as possible. A significant contribution to both of these aims is provided by using thin metal sheet for the half-shells.

A series of aligned holes 19 in the DC coupled half-shells provides a path for beam acceleration.

FIG. 4 shows a magnified part of the electrostatic generator of FIG. 3. The vacuum chamber 12 is electrically conductive, and grounded. In this example, it is spaced from the half-shells 10 by a distance d greater than the separation s between any two adjacent half-shells, although this need not be the case.

In FIG. 4, the edge regions 16 of the half-shells 101-106, 111-116 are cut square or can be rounded, particularly indicated at 23 in the magnified view of the edge region 16 of half-shell 102. This is for manufacturing convenience, as it would be very difficult to put any other edge region profile on such a thin material. The attendant corners 23 give rise to regions of high electrostatic stresses, shown at 18, due to the resulting change in field lines close to the shell edge, even with rounded edges.

Lines of electrostatic equipotential are shown in the region of gap 14. Away from the equatorial gap 14, the lines of equipotential will run parallel to the adjacent half-shell(s), but are not shown in the drawing. A bunching of lines of electrostatic equipotential represents a relatively high value of electrostatic stress.

The high electrostatic stresses are most pronounced at the edge regions 16 of the outermost half-shells 106, 116, particularly near their inner surfaces. The next most pronounced high electrostatic stresses are at the edge regions 16 of the innermost half-shells 101, 111, particularly near their outer surfaces.

Regions of high electrostatic stress are to be avoided, and to be eliminated so far as is practicable. Regions of high electric stress may cause a breakdown in the isolation between half-shells, for example through vacuum or air. Such electrostatic discharge will cause damage to the material of the shells, and a loss of accumulated charge, meaning that a target voltage of the innermost DC-connected half-shell may not be reached. The sudden peaks in current associated with electrostatic discharge may damage the power supply and diodes associated with the electrostatic generator.

In pursuit of the aims of a small size and light weight, the electrostatic generator will typically be constructed with a minimum number of concentric shells. This will in turn mean that a relatively large potential difference arises between adjacent DC half-shells, tending to encourage electrostatic breakdown.

Although some rounding of the corners 23 has been employed in known arrangements, the high stress regions 18 have been found not significantly diminished by these efforts.

SUMMARY OF THE INVENTION

The present invention provides an improved electrostatic generator, and an improved particle accelerator employing such an accelerator, having an improved geometry of the edge regions 16 of the half-shells in the region of the equatorial gap 14, whereby peak electrostatic stress is reduced.

The above object is achieved in accordance with the present invention by a high-voltage electrostatic generator that has an assembly of concentric, electrically conductive half-shells that are separated by an equatorial gap that proceeds around an axis essentially with cylindrical symmetry with respect to the axis. The edge regions, which are adjacent to the equatorial gap, of at least a selected subset of the half-shells, are shaped so that those edge regions of radially outer half-shells of the subset flare radially away from the axis, while edge regions of radially inner half-shells of the subset flare radially inwardly. The flaring of all of the edge regions causes the flared edge regions to be substantially aligned parallel to lines of electrostatic equipotential in the vicinity of those edge regions, thereby minimizing electrostatic stress in the vicinity of each flared edge region.

The above object also is achieved in accordance with the present invention by a method for designing a high-voltage electrostatic generator as described above, wherein a numerical model of a starting arrangement of the half-shells is provided to a computer and, in the computer, lines of electrostatic potential are simulated, which would be generated by the modelled arrangement during use of the generator. The computer adapts the model to more closely align the edge regions of the half-shells in the subset with corresponding lines of electrostatic potential. The adapted model is then emitted, or otherwise made available, at an output of the computer in electronic form, as a data file.

DESCRIPTION OF THE PREFERRED EMBODIMENTS

According to the present invention, geometry of the edge regions 16 of the half-shells in the region of the equatorial gap 14 is amended, whereby peak electrostatic stress is reduced.

Figure 4:
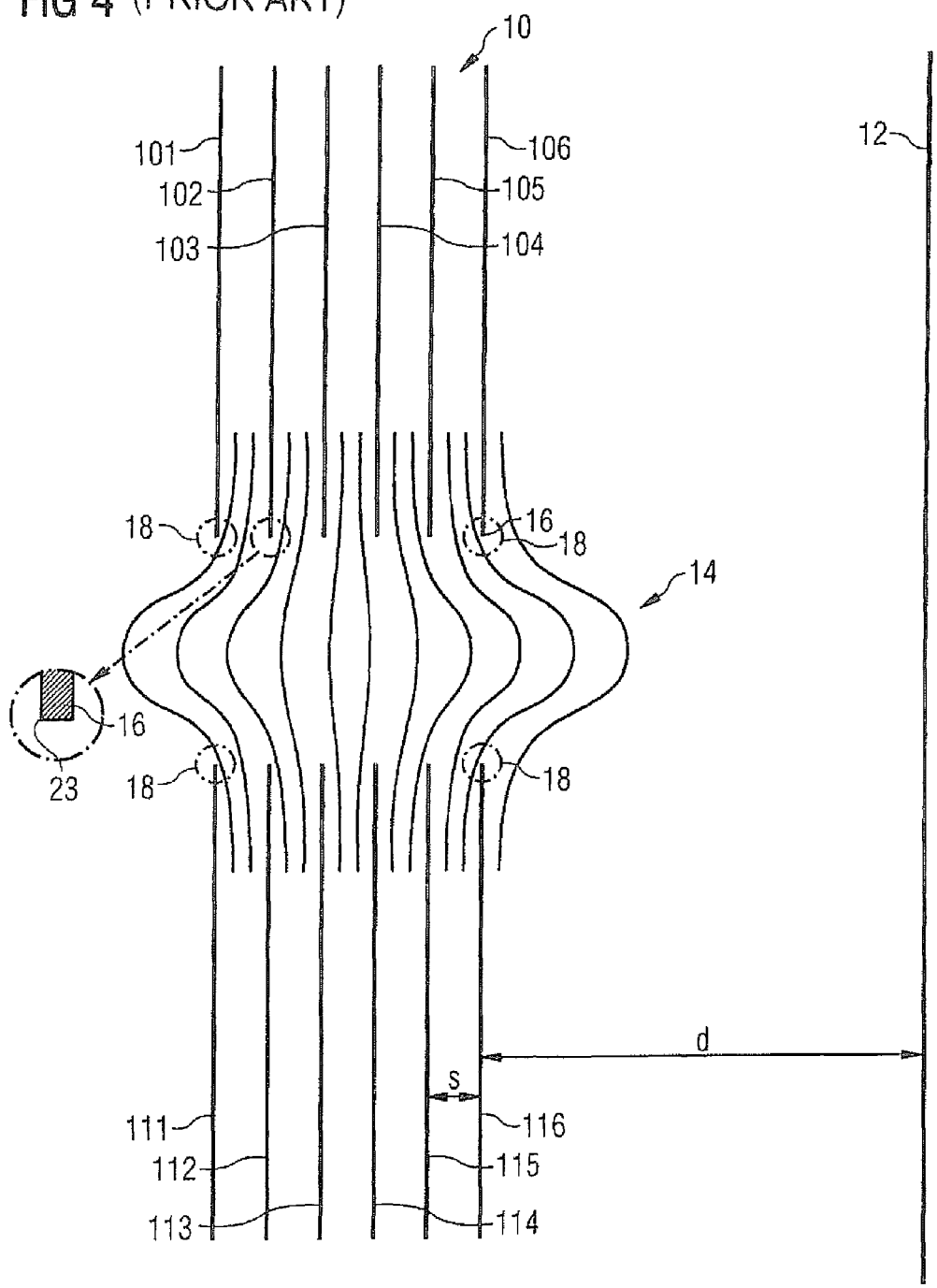
FIG. 4 represents a magnified portion of the partial cross-section of FIG. 3, which illustrates regions of electrostatic stress by representations of electrostatic equipotentials.

Considering the conventional arrangement of FIG. 4, it can be seen that regions 15 of high electrostatic stress occur where the electrostatic equipotentials deviate significantly from being parallel to the surfaces of the adjacent half-shells 10. In the illustrated example, this occurs near the equatorial gap 14 at the edge regions 16 of the half-shells.

According to a feature of the present invention, edge regions 16 of the half-shells 10 are deformed away from their parallel arrangement of FIG. 4 in order to ensure that the adjacent electrostatic equipotentials are approximately parallel to the surfaces of the half-shells, even at the edge regions 16.

Figure 5:
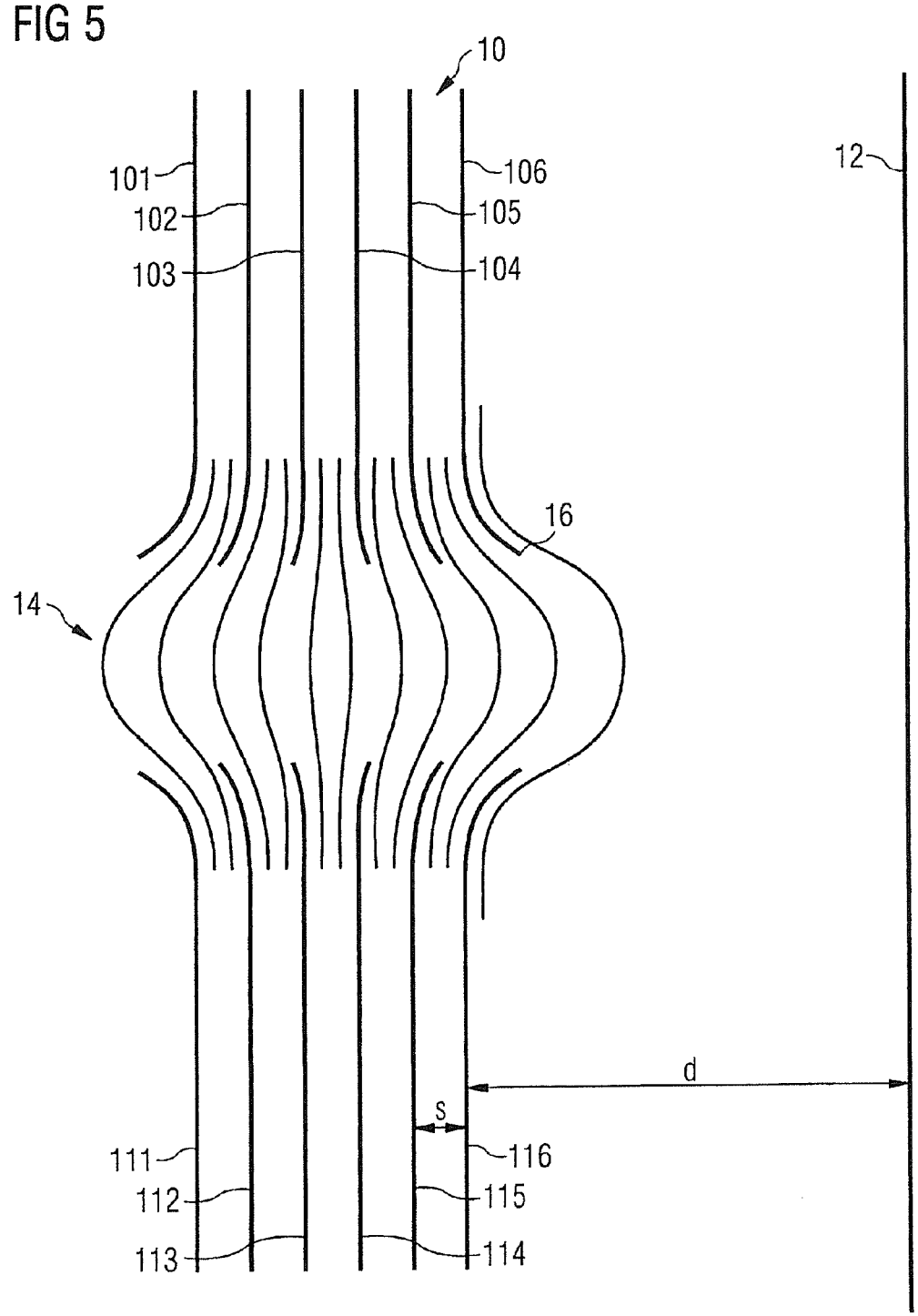
FIGS. 5-9 illustrate magnified part-cross sections, corresponding to the view in FIG. 4, of embodiments of the present invention, comprising improved geometry of the edge regions of half-shells on the electrostatic generator in the region of the equatorial gap and showing lines of electrostatic equipotential.

FIG. 5 shows a view similar to the view of FIG. 4, according to an embodiment of the invention, in which the edge regions 16 of the half-shells 10 are deformed away from their parallel arrangement. The electrostatic equipotentials shown are approximately parallel to the surfaces of the half-shells, even at their edge regions 16.

As shown in FIG. 5, this is achieved by shaping the region of the half-shells 10 near their edge regions 16 to follow the local lines of electrostatic equipotential. As can be seen in FIG. 5, this is achieved by increasingly shaping edge regions 16 of inner and outer half-shells 10 away from the adjacent half-shells. So, outer half-shells such as 105, 115, 106, 116 have edge regions 16 which flare radially outward, away from axis A-A and toward vacuum vessel 12, while inner half-shells such as 101, 111, 102, 112 have edge regions 16 which flare radially inward, towards axis A-A and away from vacuum vessel 12.

As can be seen in FIG. 5, such shaping of edge regions follows the shape of the lines of electrostatic equipotential in the vicinity of the edge regions 16 of the half-shells 10.

Intermediate half-shells such as 103, 113, 104, and 114 have edge regions which are not significantly flared. For reasons of manufacturing economy, in some embodiments of the present invention, the edge regions of such intermediate half-shells may be intentionally left un-flared.

As can be seen, the arrangement of FIG. 5 contains no regions of high electrostatic stress of intensity comparable to the intensity of electrostatic stress in regions 18 shown in FIG. 4

Possible methods of designing the shapes of flaring to be applied to the edge regions 16 of the half-shells according to the invention will now be described. These methods are based on the use of well-known computer implemented numerical modelling tools.

A numerical model of the simple conventional arrangement of FIG. 4 may be used as a starting point. Numerical calculations may be performed using any of the field modelling tools which are conventional and readily available to those skilled in the art. The electrostatic equipotentials in the region of the edge regions 16 are plotted.

Next, the numerical model is altered to provide flaring on the edge regions 16 of the half-shells, this flaring being arranged so that the flared edge regions follow the corresponding line of electrostatic equipotential plotted in the previous step. The modelling of lines of electrostatic equipotential is carried out for this altered model.

FIG. 5 illustrates a model at this stage in the design. It may be decided that such a design is sufficient, and an electrostatic accelerator may be constructed with flared edge regions as calculated at this stage, and as shown in FIG. 5.

However, as can be seen particularly with the outermost and innermost shells in FIG. 5, the applied flaring may now be excessive. The electrostatic stresses throughout the design have been relieved, and the lines of electrostatic equipotential may not flare so far away from the nominal surface of the half-shells as was previously the case. At the edge regions of half-shells 106 and 116 for example, increased electrostatic stress can be seen on the outermost surface, with reduced stress on the inner surface.

The modelling step previously described may be carried out again, to refine the applied flaring. The flaring applied to the edge regions 16 of the half-shells is again adjusted to follow the appropriate calculated equipotential. This will typically result in a reduced flaring for all half-shells, as illustrated in FIG. 6.

This iterative process may be carried out any number of times until the designer is satisfied with the design. It is common that a designed structure such as the described electrostatic accelerator does not act exactly as designed when it is constructed. For that reason, it may be found unnecessary to persevere with a large number of iterations at the design stage.

Figure 6:
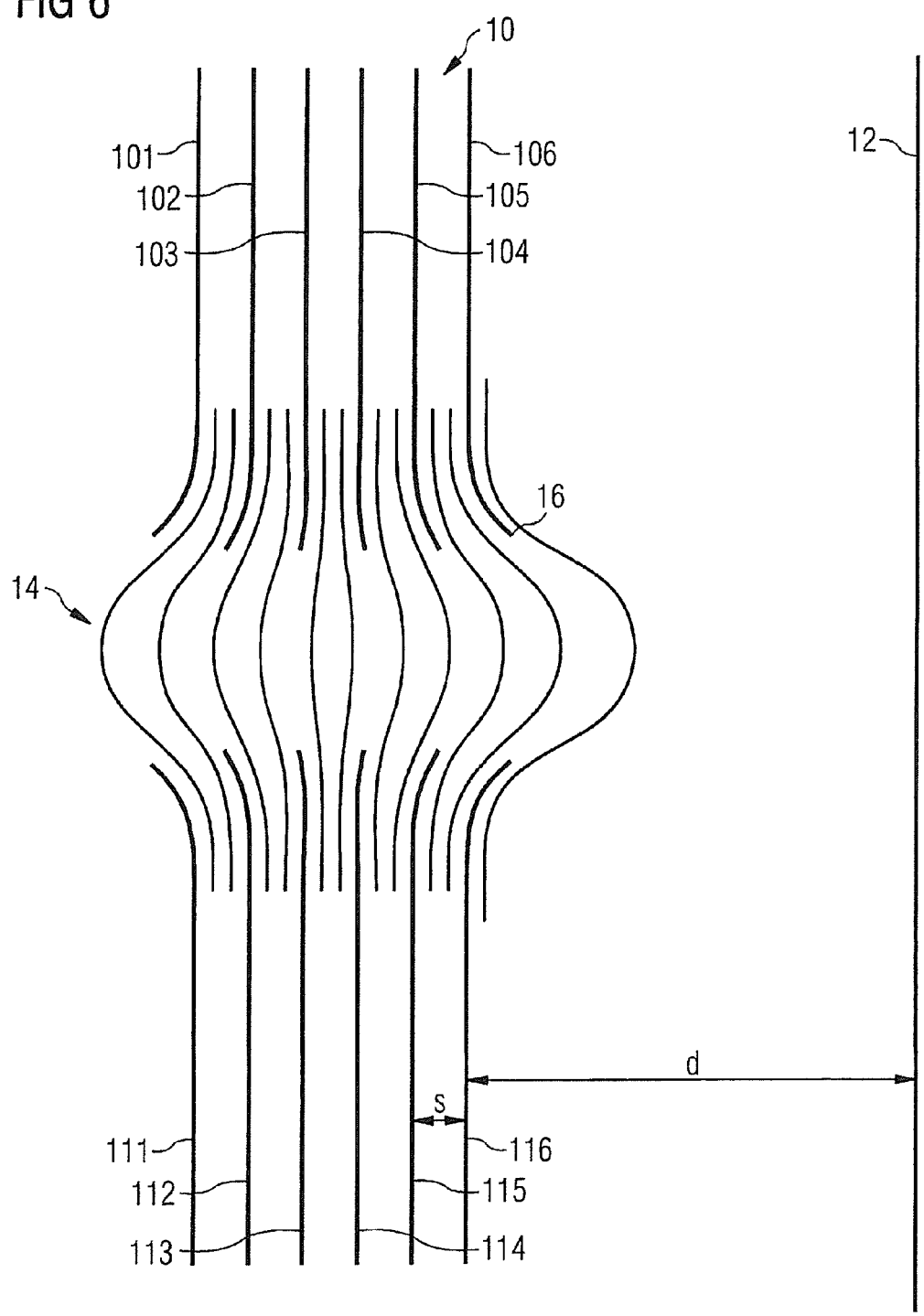

FIG. 6 shows a design of flared half-shells 10 which may be found satisfactory. The flared edge regions 16 of the half-shells are approximately parallel to the electrostatic equipotentials, and no regions of increased electrostatic stress are present.

The flaring of each edge region 16 of a half shell represents a significant step in the manufacturing process. In FIG. 6, intermediate half-shells 103, 104, 113, 114 are each flared, but the flares are minor. For economy of manufacture, one may decide not to flare those half-shells, but to constrain them in their original unflared positions as shown in FIG. 4. The numerical model may be recalculated without any flare on these half-shells, to ensure that no regions of unacceptably high electrostatic stress are produced.

Figure 7:
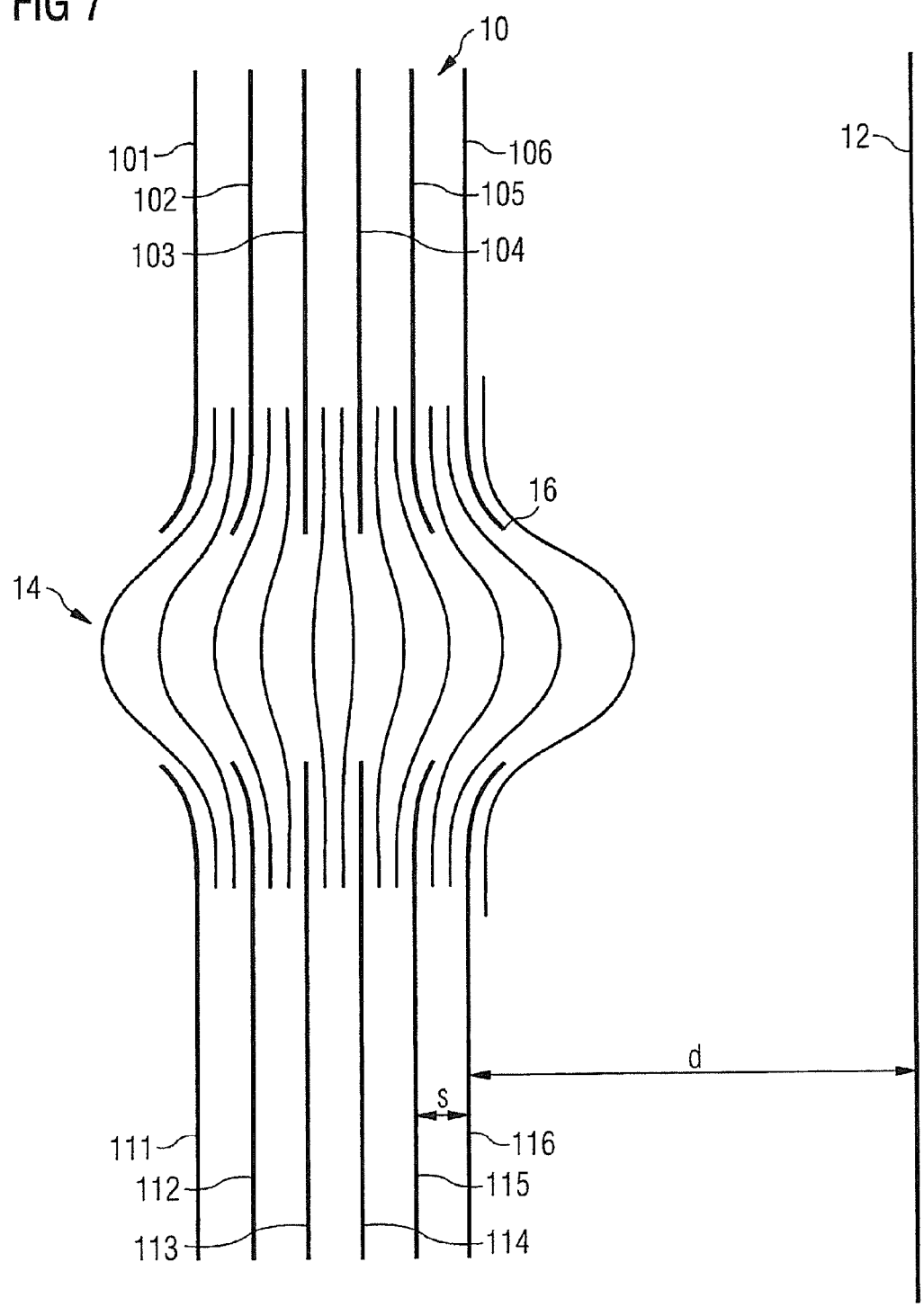

FIG. 7 shows an example of such a design, where radially inner half-shells 101, 111, 102, 112 and radially outer half-shells 105, 115, 106, 116 are flared, but intermediate half-shells 103, 113, 104, 114 are not flared. The modelled electrostatic equipotentials show a slight increase in electrostatic stress in the region of the edge regions 16 of the unflared half-shells, but these are of much reduced significance as compared to the electrostatic stresses arising in regions 18 illustrated in FIG. 4. A design such as illustrated in FIG. 7 may represent an optimum compromise of manufacturing efficacy and operational performance.

Figure 1:
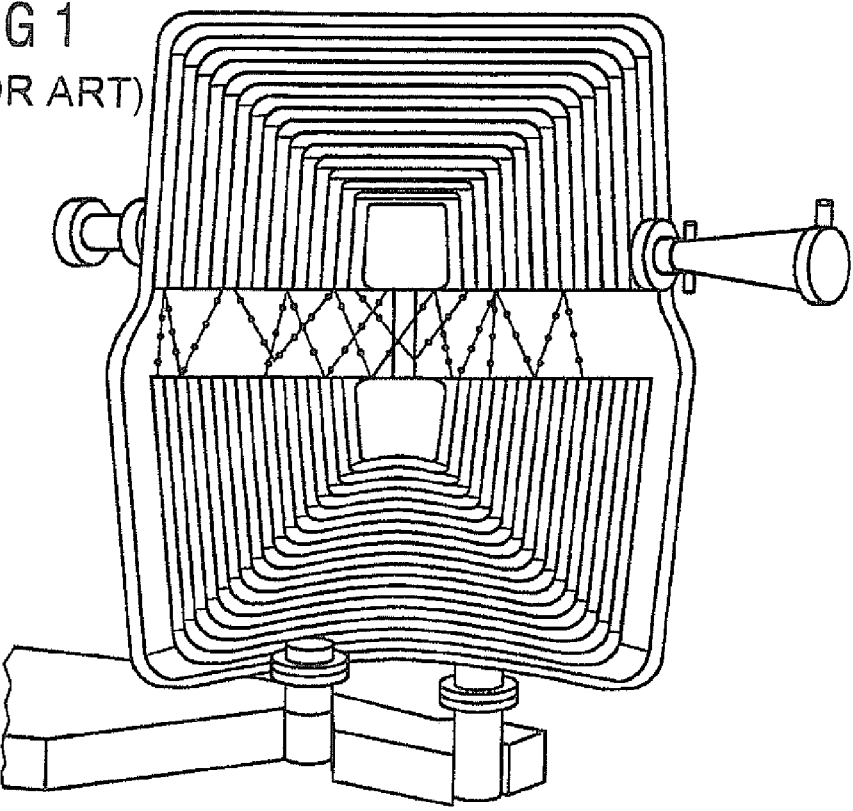
FIG. 1 schematically illustrates a cross-section of a conventional high-voltage electrostatic particle accelerator including a high-voltage electrostatic generator such as may be addressed by the present invention.
Figure 2:
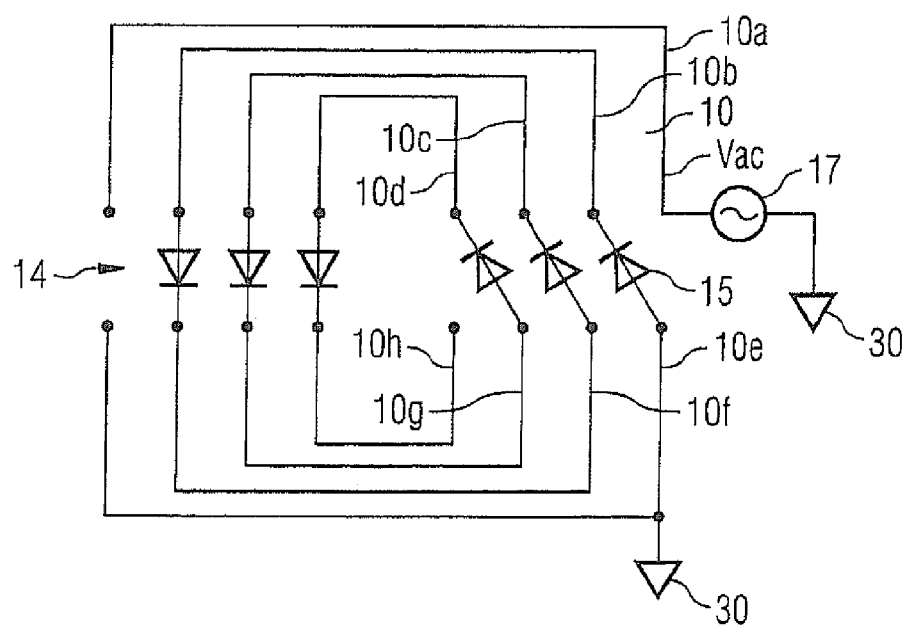
FIG. 2 schematically illustrates electrical connections involved in an electrostatic generator such as shown in FIG. 1.
Figure 3:
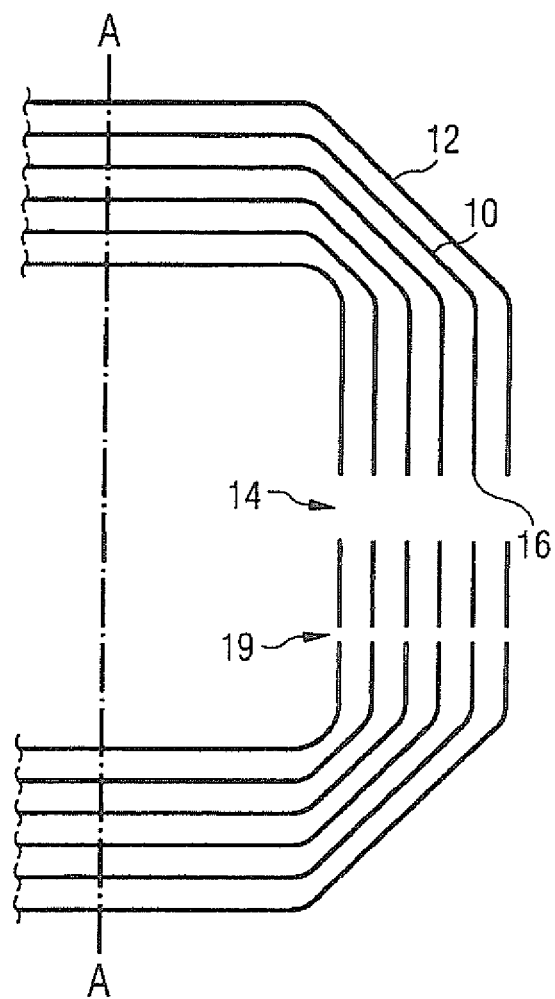
FIG. 3 illustrates a partial cross-section of another conventional high-voltage electrostatic particle accelerator such as may be addressed by the present invention.
Figure 8:
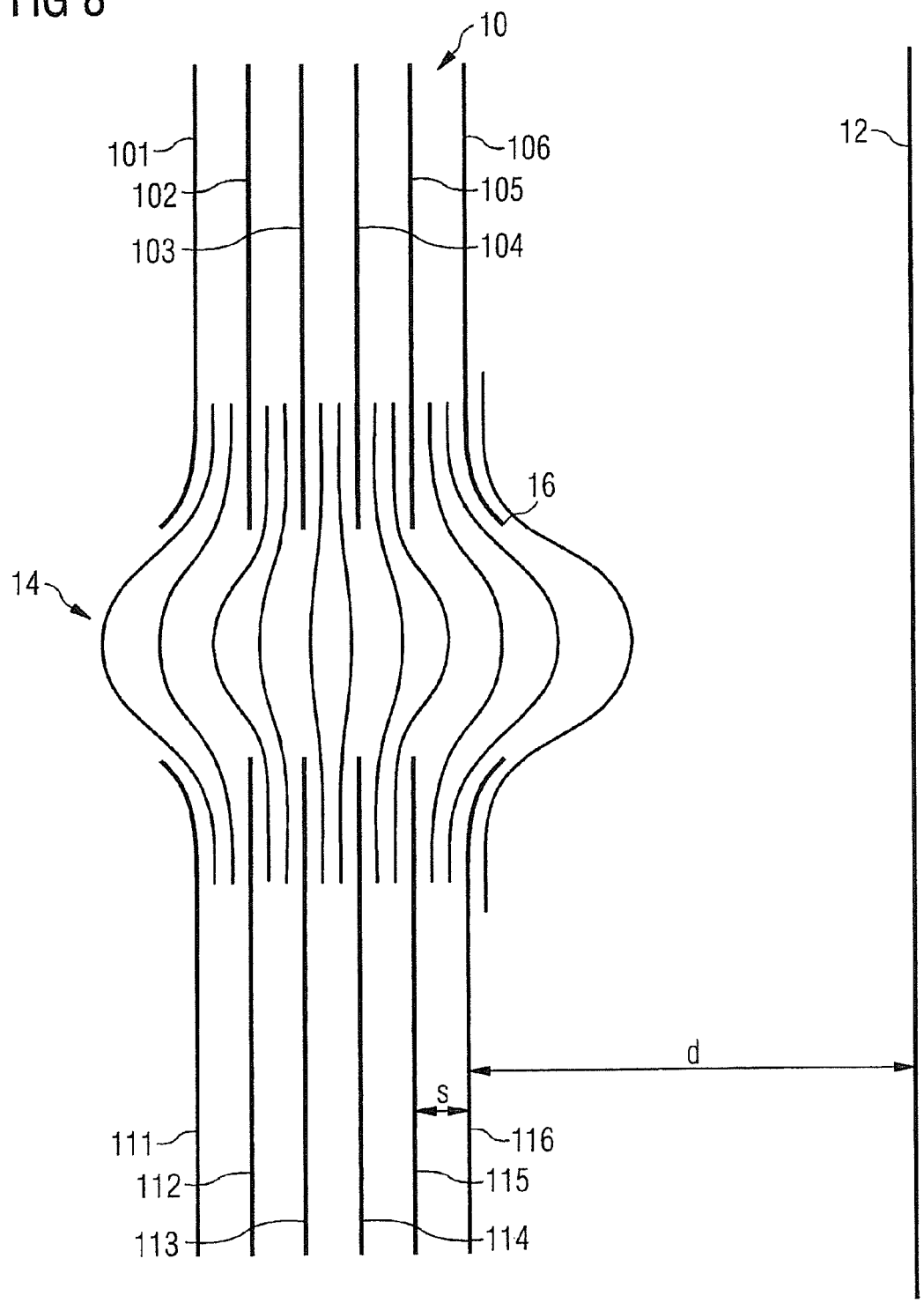

FIG. 8 shows a development of this version. In the design of FIG. 8, all half-shells are constrained to remain unflared, except for the radially innermost 101, 111 and radially outermost 106, 116. The manufacture of such an electrostatic accelerator will require fewer flaring operations than an embodiment such as shown in FIG. 6, where all half-shells are flared, yet the peak electrostatic stresses generated may be acceptable, depending on the actual dimensions and voltages applied. In a further development of this embodiment, only the edge regions of the innermost half-shells 101, 111 may be flared. Alternatively, only the edge regions of the outermost half-shells 106, 116 may be flared As discussed with reference to FIG. 3, it is preferable that a constant voltage is present throughout the whole volume of the innermost DC half-shell, shown as 111 in FIGS. 4-8.

In arrangements such as illustrated in FIGS. 4-8, the innermost DC half-shell 111 is relatively open at the equatorial plane, corresponding to gap 14. This causes a voltage gradient within the innermost DC half-shell. As there is an AC voltage on top of an increasing DC background, the field lines on the AC half-shells will be varying at the input frequency, typically in the order of kHz, and at voltages in the order of 100 kV. While this may not be significant if the electrostatic generator is simply used as a voltage generator, it can cause problems if the electrostatic generator is used in a particle accelerator.

Figure 9:
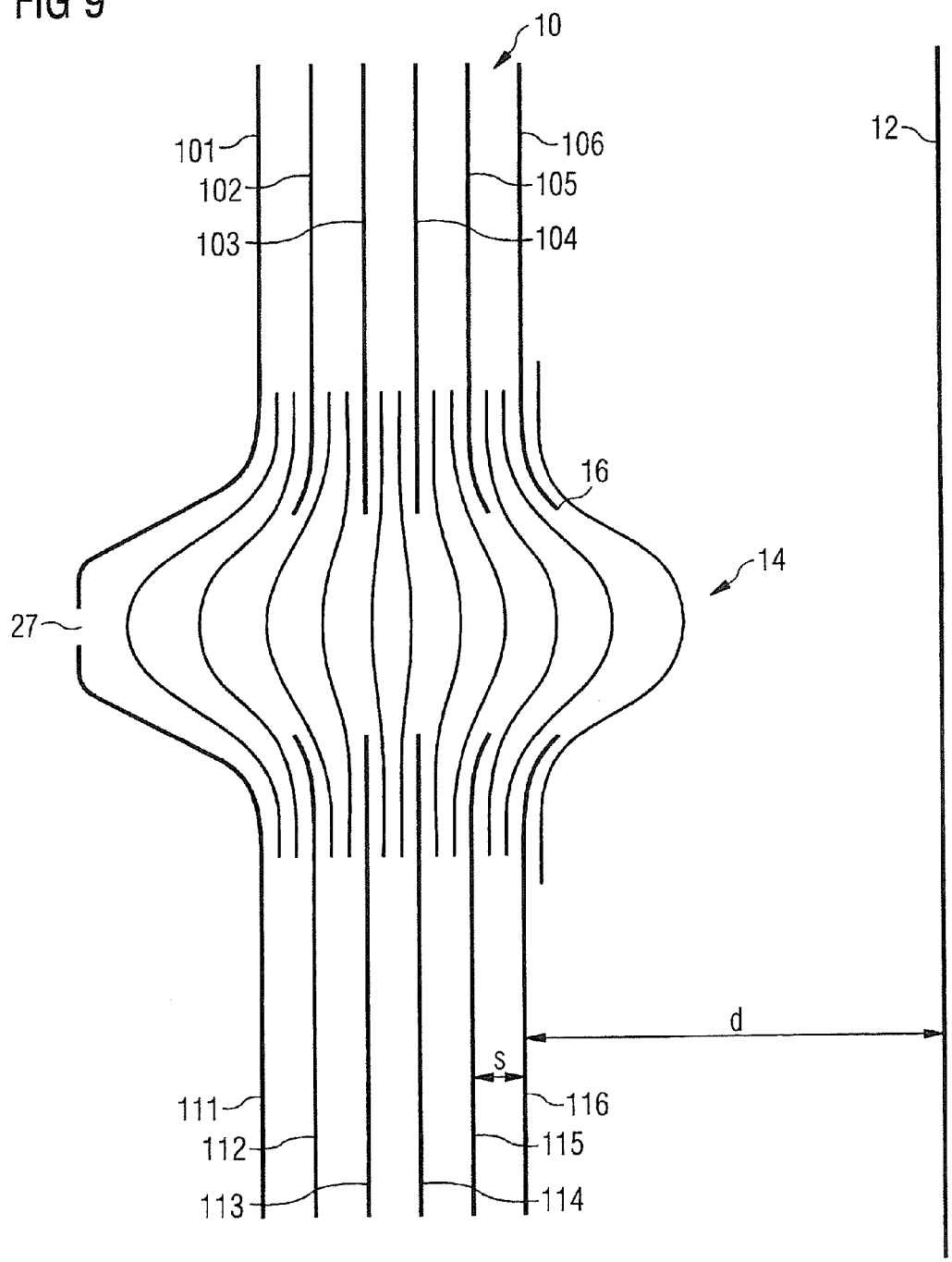

FIG. 9 illustrates a further embodiment of the present invention, in which the innermost half-shells 101, 111 are partially closed in the region of the equatorial plane.

This may be regarded as an extreme flaring of the radially innermost half-shells. A much reduced equatorial gap 14' is provided between the innermost AC half-shell 101 and the innermost DC half-shell 111. The flaring continues such that an equatorial opening 27 of each of the radially innermost half-shells has a diameter much reduced as compared to the diameter of the half-shell as a whole.

As the radially innermost DC half-shell 111 in this arrangement is relatively closed, the voltage within the half-shell 111 will be relatively constant, and the tendency for a voltage gradient to deflect a beam of charged particles within the half-shell 111 will be much reduced.

Figure 10:
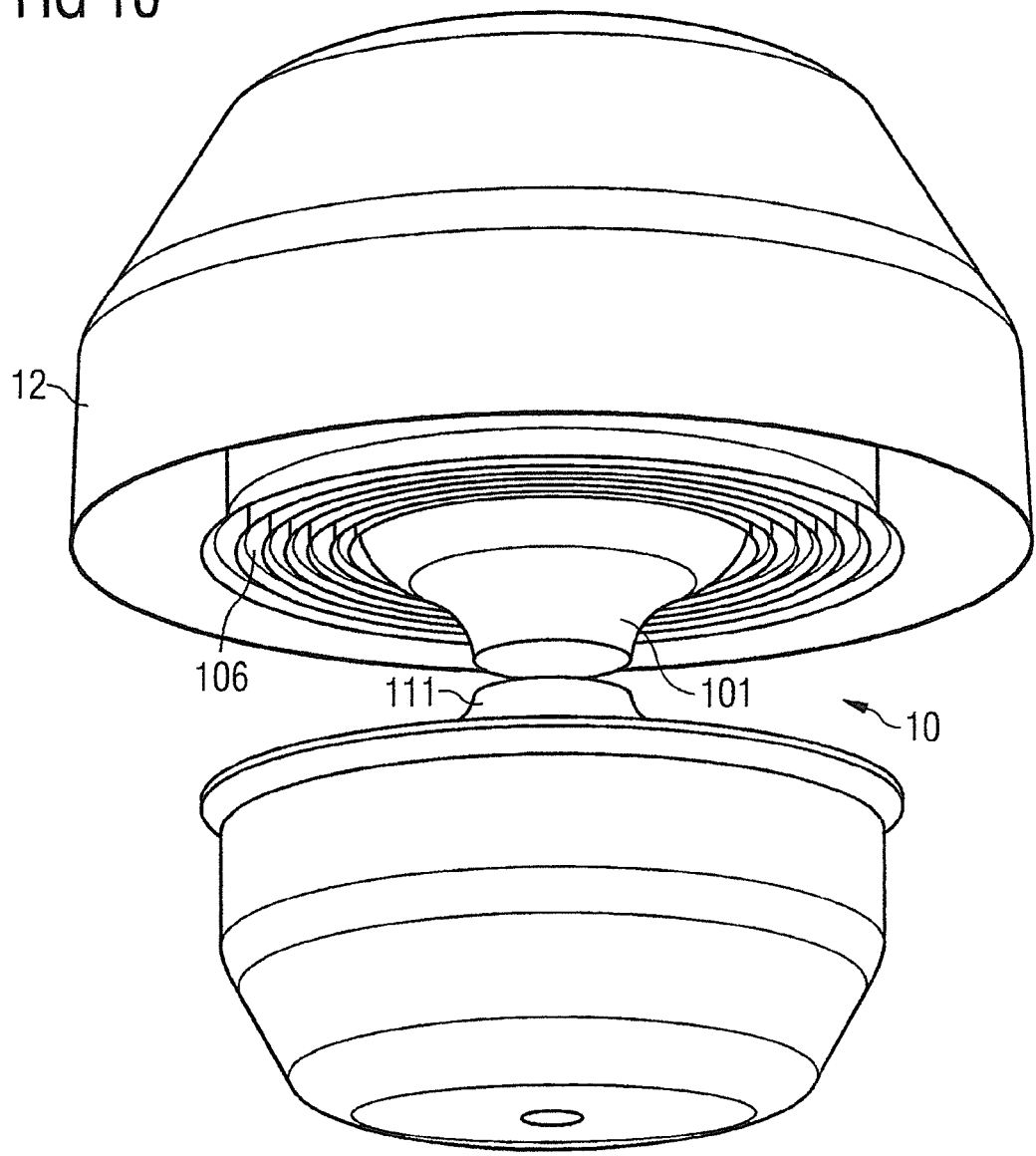
FIG. 10 shows a perspective view of a practical high-voltage electrostatic generator according to an embodiment of the invention, showing a practical 3D application of shell shaping and de-stressing according to the present invention.

FIG. 10 shows a perspective view of a practical high-voltage electrostatic generator according to an embodiment of the invention, such as described with reference to FIG. 9.

According to the present invention, edge regions of at least some of the half-shells are flared de-stressing the electrostatic field in those regions, which enables a reduction in size and spacing of the shells. The actual configuration of flaring required is dependent on the size and shape of the shells, and is best determined by iterative modelling and simulation as described above. Reducing the electrostatic stress reduces the probability of breakdown. It is found that more compact arrangements may be constructed with increased applied voltage. The modifications provided by the present invention in turn increase the opportunity to achieve higher electrostatic field gradients.

Although modifications and changes may be suggested by those skilled in the art, it is the intention of the inventors to embody within the patent warranted hereon all changes and modifications as reasonably and properly come within the scope of their contribution to the art.

We claim as our invention:
1. A high-voltage electrostatic generator comprising:
   an assembly of concentric electrically conductive half-shells, said assembly having an equator, with half-shells on one side of said equator being separated from half-shells on an opposite side of said equator by a gap in which said equator is situated, essentially with cylindrical symmetry about an axis that is perpendicular to a plane containing said equator, thereby defining inner half-shells that are radially closer to said axis and that are radially inside outer half-shells that are radially farther from said axis; and
   each of said half-shells having an edge region adjacent to the gap, with the respective edge regions of at least some of the half-shells being shaped, so that edge regions of at least some of said radially outer half-shells flare radially away from the axis, while edge regions of at least some of said radially inner half-shells flare radially inwardly toward said axis, thereby giving at least a subset of said half-shells flared edge regions, so as to make the flared edge regions substantially parallel to lines of electrostatic equipotential in a vicinity of said flared edge regions and thereby to minimizing electrostatic stress in the vicinity of each flared edge region.
2. A high-voltage electrostatic generator according to claim 1 wherein the subset comprises radially outermost half-shells.

3. A high-voltage electrostatic generator according to claim 1 wherein the subset comprises radially innermost half-shells.

4. A high-voltage electrostatic generator according to claim 1 wherein the subset comprises all half-shells.

5. A high-voltage electrostatic generator according to claim 1 wherein half-shells in said assembly, other than the half-shells of the subset, have unflared edge regions.

6. A high-voltage electrostatic generator according to claim 3 wherein the flaring of radially innermost half-shells continues such that the gap between the radially innermost half-shells is smaller than the gap between all other half-shells.

* * * * *